United States Patent
Park et al.

(10) Patent No.: US 10,566,471 B2
(45) Date of Patent: Feb. 18, 2020

(54) COMPOSITION FOR SOLAR CELL ELECTRODES AND ELECTRODE FABRICATED USING THE SAME

(71) Applicant: SAMSUNG SDI CO., LTD., Yongin-si, Gyeonggi-do (KR)

(72) Inventors: Sang Hee Park, Uiwang-si (KR); Hyun Jin Koo, Uiwang-si (KR); Dae Sub Song, Uiwang-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 447 days.

(21) Appl. No.: 14/570,514

(22) Filed: Dec. 15, 2014

(65) Prior Publication Data

US 2015/0191609 A1   Jul. 9, 2015

(30) Foreign Application Priority Data

Jan. 9, 2014   (KR) .................. 10-2014-0003038

(51) Int. Cl.
*H01B 1/02* (2006.01)
*H01B 1/08* (2006.01)
*H01L 31/0224* (2006.01)

(52) U.S. Cl.
CPC ............ *H01L 31/0224* (2013.01); *H01B 1/02* (2013.01); *H01B 1/08* (2013.01)

(58) Field of Classification Search
CPC .................................. H01B 1/02; H01B 1/08
See application file for complete search history.

(56) References Cited

U.S. PATENT DOCUMENTS

| | | | | |
|---|---|---|---|---|
| 8,551,368 | B2* | 10/2013 | Nakamura | C03C 3/062 252/514 |
| 2013/0270489 | A1 | 10/2013 | Wang et al. | |
| 2015/0115207 | A1* | 4/2015 | Shih | H01L 31/022425 252/514 |

FOREIGN PATENT DOCUMENTS

| | | |
|---|---|---|
| CN | 102081986 A | 6/2011 |
| CN | 102476919 A | 5/2012 |
| CN | 102956283 A | 3/2013 |
| CN | 103440897 A | 12/2013 |
| CN | 103440900 A | 12/2013 |
| CN | 103493148 A | 1/2014 |

OTHER PUBLICATIONS

Chinese Office Action dated Dec. 22, 2016.
Chinese Office Action dated May 5, 2016 in Corresponding Chinese Patent Application No. 20140837030.8.
Provisional double patenting rejection over claims of the above-identified application; USPTO Office action dated Mar. 24, 2016, in U.S. Appl. No. 14/712,719.
Korean Office Action dated May 30, 2016.

* cited by examiner

*Primary Examiner* — William D Young
(74) *Attorney, Agent, or Firm* — Lee & Morse, P.C.

(57) ABSTRACT

A composition for solar cell electrodes includes a silver (Ag) powder, a glass frit containing silver (Ag), tellurium (Te) and zinc (Zn), and an organic vehicle, wherein the glass frit has a mole ratio of Ag to Te ranging from about 1:0.1 to about 1:50 and a mole ratio of Ag to Zn ranging from about 1:0.1 to about 1:40.

8 Claims, 1 Drawing Sheet

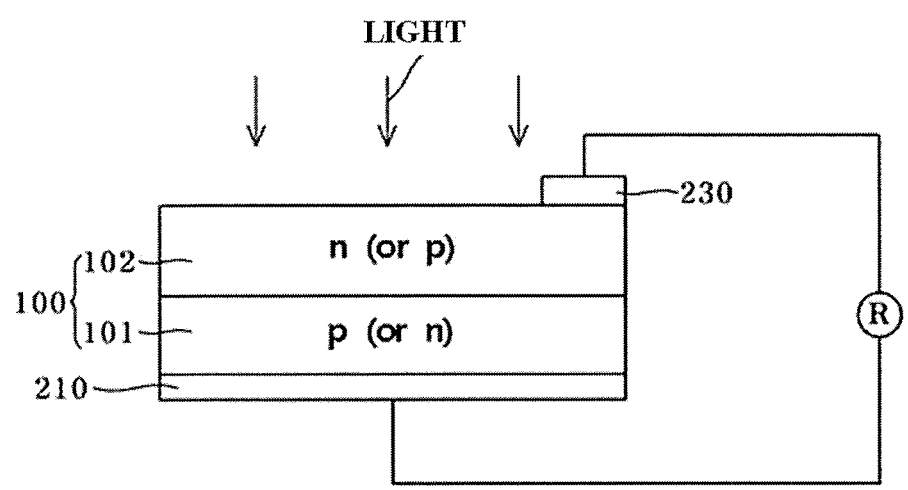

COMPOSITION FOR SOLAR CELL ELECTRODES AND ELECTRODE FABRICATED USING THE SAME

CROSS-REFERENCE TO RELATED APPLICATION

Korean Patent Application No. 10-2014-0003038, filed on Jan. 9, 2014, in the Korean Intellectual Property Office, and entitled: "Composition for Solar Cell Electrodes and Electrode Fabricated Using the Same," is incorporated by reference herein in its entirety.

BACKGROUND

1. Field

The embodiments relate to a composition for solar cell electrodes and electrodes fabricated using the same.

2. Description of the Related Art

Solar cells generate electricity using the photovoltaic effect of a p-n junction which converts photons of sunlight into electricity. In the solar cell, front and rear electrodes are formed on upper and lower surfaces of a semiconductor wafer or substrate with the p-n junctions, respectively. Then, the photovoltaic effect at the p-n junction is induced by sunlight entering the semiconductor wafer and electrons generated by the photovoltaic effect at the p-n junction provide electric current to the outside through the electrodes. The electrodes of the solar cell are formed on the wafer by applying, patterning, and baking an electrode composition.

SUMMARY

Embodiments are directed to a composition for a solar cell electrode including a silver (Ag) powder, a glass frit containing silver (Ag), tellurium (Te) and zinc (Zn), and an organic vehicle. The glass frit has a mole ratio of Ag to Te ranging from about 1:0.1 to about 1:50 and a mole ratio of Ag to Zn ranging from about 1:0.1 to about 1:40.

The glass frit may further include one or more of lead (Pb), bismuth (Bi), phosphorus (P), germanium (Ge), gallium (Ga), cerium (Ce), iron (Fe), silicon (Si), lithium (Li), tungsten (W), magnesium (Mg), cesium (Cs), strontium (Sr), molybdenum (Mo), titanium (Ti), tin (Sn), indium (In), vanadium (V), ruthenium (Ru), barium (Ba), nickel (Ni), copper (Cu), sodium (Na), potassium (K), arsenic (As), cobalt (Co), zirconium (Zr), manganese (Mn), neodymium (Nd), chromium (Cr), antimony (Sb) or aluminum (Al).

The glass frit may contain about 0.1 mol % to about 50 mol % of the silver (Ag) based on the total moles of the glass frit.

The glass frit may be formed of a silver compound and a metal oxide, the metal oxide including tellurium oxide and zinc oxide The silver compound may include one or more of silver cyanide, silver nitrate, silver halide, silver carbonate, or silver acetate.

The metal oxide may further include one or more of a lead (Pb) oxide, a bismuth (Bi) oxide, a phosphorus (P) oxide, a germanium (Ge) oxide, a gallium (Ga) oxide, a cerium (Ce) oxide, an iron (Fe) oxide, a silicon (Si) oxide, a lithium (Li) oxide, a tungsten (W) oxide, a magnesium (Mg) oxide, a cesium (Cs) oxide, a strontium (Sr) oxide, a molybdenum (Mo) oxide, a titanium (Ti) oxide, a tin (Sn) oxide, an indium (In) oxide, a vanadium (V) oxide, a ruthenium (Ru) oxide, a barium (Ba) oxide, a nickel (Ni) oxide, a copper (Cu) oxide, a sodium (Na) oxide, a potassium (K) oxide, an arsenic (As) oxide, a cobalt (Co) oxide, a zirconium (Zr) oxide, a manganese (Mn) oxide, a neodymium (Nd) oxide, a chromium (Cr) oxide, an antimony (Sb) oxide, or an aluminum (Al) oxide.

The composition may include about 60 wt % to about 95 wt % of the silver powder, about 0.1 wt % to about 20 wt % of the glass fit, and about 1 wt % to about 30 wt % of the organic vehicle.

The glass frit may have an average particle size (D50) ranging from about 0.1 μm to about 10 μm.

The composition may further include one or more of a dispersant, a thixotropic agent, a plasticizer, a viscosity stabilizer, an antifoaming agent, a pigment, a UV stabilizer, an antioxidant, and a coupling agent.

Embodiments are also directed to a solar cell electrode prepared from the composition for solar cell electrodes.

BRIEF DESCRIPTION OF THE DRAWING

Features will become apparent to those of skill in the art by describing in detail exemplary embodiments with reference to the attached drawing in which:

FIG. 1 illustrates a schematic view of a solar cell in accordance with an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing FIGURE, the dimensions of layers and regions may be exaggerated for clarity of illustration.

Composition for Solar Cell Electrodes

A composition for solar cell electrodes may include a silver (Ag) powder; a glass frit containing silver (Ag), tellurium (Te) and zinc (Zn); and an organic vehicle. The glass frit may have a mole ratio of Ag to Te ranging from about 1:0.1 to about 1:50 and a mole ratio of Ag to Zn ranging from about 1:0.1 to about 1:40. As used herein, the term "mole ratio" refers to a mole ratio of each metal element.

Each component of the composition for solar cell electrodes is described herein in more detail.

(A) Silver Powder

The composition for solar cell electrodes may include a silver (Ag) powder as a conductive powder. The particle size of the silver powder may be on a nanometer or micrometer scale. For example, the silver powder may have a particle size of dozens to several hundred nanometers, or several to dozens of micrometers. In some implementations, the silver powder may be a mixture of two or more types of silver powders having different particle sizes.

The silver powder may have a spherical, flake or amorphous shape.

In an embodiment, the silver powder may have an average particle diameter (D50) from about 0.1 μm to about 10 μm. In another embodiment, the silver powder may have an average particle diameter (D50) from about 0.5 μm to about 5 nm. The average particle diameter may be measured using, for example, a Model 1064D (CILAS Co., Ltd.) after dispersing the conductive powder in isopropyl alcohol (IPA) at 25° C. for 3 minutes via ultrasonication. Within this range of average particle diameter, the composition may provide low contact resistance and low line resistance.

The silver powder may be present in an amount of about 60 wt % to about 95 wt % based on the total weight of the composition. Within this range, the conductive powder may prevent deterioration in conversion efficiency due to increase in resistance and difficulty in forming the paste due to relative reduction in amount of the organic vehicle. In some embodiments, the conductive powder may be present in an amount of about 70 wt % to about 90 wt %.

(B) Glass Frit

The glass frit may serve to enhance adhesion between the conductive powder and the wafer. The glass frit may serve to form silver crystal grains in an emitter region by etching an anti-reflection layer and melting the silver powder so as to reduce contact resistance during the baking process of the composition for electrodes. Further, during the baking process, the glass frit may soften and decreases the baking temperature.

When the area of the solar cell is increased in order to improve solar cell efficiency, there solar cell contact resistance may increase. Thus, it is desirable to minimize both serial resistance and influence on the p-n junction. In addition, the baking temperatures may vary within a broad range with increasing use of various wafers having different sheet resistances. In this case, it is desirable that the glass frit secure sufficient thermal stability to withstand a wide range of baking temperatures.

The glass fit may be formed of a silver (Ag) compound and a metal oxide. The glass fit may be prepared by mixing, melting, and pulverizing a silver compound having a decomposition temperature of about 1,000° C. or less (at which temperature the silver compound is decomposed into Ag ions), and a metal oxide. The metal oxide may include at least one kind of metal oxide.

The silver compound may be or include an ionic compound. The silver compound may include silver cyanide (AgCN), silver nitrate ($AgNO_3$), silver halide (Ag—X), silver carbonate ($Ag_2CO_3$), silver acetate ($AgC_2H_3O_2$), silver oxide ($Ag_2O$), or mixtures thereof. In the silver halide (Ag—X), X may be iodine, fluorine, chlorine, or bromine. For example, X may be iodine.

In an embodiment, the metal oxide may include tellurium oxide and zinc oxide.

In another embodiment, the metal oxide may further include one or more of a lead (Pb) oxide, a bismuth (Bi) oxide, a phosphorus (P) oxide, a germanium (Ge) oxide, a gallium (Ga) oxide, a cerium (Ce) oxide, an iron (Fe) oxide, a silicon (Si) oxide, a lithium (Li) oxide, a tungsten (W) oxide, a magnesium (Mg) oxide, a cesium (Cs) oxide, a strontium (Sr) oxide, a molybdenum (Mo) oxide, a titanium (Ti) oxide, a tin (Sn) oxide, an indium (In) oxide, a vanadium (V) oxide, a barium (Ba) oxide, a nickel (Ni) oxide, a copper (Cu) oxide, a sodium (Na) oxide, a potassium (K) oxide, an arsenic (As) oxide, a cobalt (Co) oxide, a zirconium (Zr) oxide, a manganese (Mn) oxide, a neodymium (Nd) oxide, a chromium (Cr) oxide, an antimony (Sb) oxide, or an aluminum (Al) oxide.

In an embodiment, the glass frit prepared from the silver compound and the metal oxide may include silver (Ag), tellurium (Te), and zinc (Zn).

The glass frit may have a mole ratio of Ag to Te ranging from about 1:0.1 to about 1:50. In some embodiments, the glass fit may have a mole ratio of Ag to Te ranging from about 1:0.5 to about 1:40. When the glass frit contains an amount of Te such that the mole ratio of Ag to Te is greater than about 1:50, the content of Ag in the glass may be sufficient to provide desirable effects. When the mole ratio of Ag to Te is less than about 1:0.1, deterioration of inherent properties of glass from an excess of silver may be avoided.

In addition, the glass frit may have a mole ratio of Ag to Zn ranging from about 1:0.1 to about 1:40. In some embodiments, the glass frit may have a mole ratio of Ag to Zn ranging from about 1:0.1 to about 1:35. When the glass fit contains an amount of Zn such that the mole ratio of Ag to Zn is greater than about 1:40, the content of Ag in the glass may be sufficient to provide desired effects. When the mole ratio of Ag to Zn is less than about 1:0.1, deterioration of inherent properties of glass from an excess of silver may be avoided.

In another embodiment, the glass fit may further include one or more of lead (Pb), bismuth (Bi), phosphorus (P), germanium (Ge), gallium (Ga), cerium (Ce), iron (Fe), silicon (Si), lithium (Li), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), neodymium (Nd), chromium (Cr), antimony (Sb), or aluminum (Al).

The glass fit may contain about 0.1 mol % to about 50 mol % of silver, for example, about 0.5 mol % to about 40 mol % of silver, based on the total moles of the glass frit.

The elemental metals contained in the glass frit may be measured by Inductively Coupled Plasma-Optical Emission Spectroscopy (ICP-OES). ICP-OES requires very small sample amounts, and thus, sample set-up time may be shortened and errors due to pre-treatment of the sample may be reduced while providing excellent analytical sensitivity.

ICP-OES may include pre-treating a sample, preparing a standard solution, and calculating the content of each element in a glass frit by measuring and converting the concentrations of target elements, thereby enabling accurate measurement of the content of each element in the glass frit.

In pre-treating a sample, a predetermined amount of the sample may be dissolved in an acid solution capable of dissolving a sample glass frit, and then heated for carbonization. The acid solution may include, for example, a sulfuric acid ($H_2SO_4$) solution.

The carbonized sample may be diluted with a solvent, such as distilled water or hydrogen peroxide ($H_2O_2$), to an appropriate extent that allows for analysis of an element to be analyzed. In view of element detection capability of an ICP-OES tester, the carbonized sample may be diluted by about 10,000×.

In measurement with the ICP-OES tester, the pre-treated sample may be calibrated using a standard solution, for example, a standard solution of an element to be analyzed.

By way of example, calculation of the mole ratio of elements in the glass frit may be accomplished by introducing the standard solution into the ICP-OES tester and plotting a calibration curve with an external standard method, followed by measuring and converting the concentration (ppm) of the element to be analyzed in the pre-treated sample using the ICP-OES tester.

The glass frit may be prepared from the silver compound and the metal oxide, as described above, by a suitable method. For example, the silver compound and the metal oxide may be mixed in a predetermined ratio. Mixing may be carried out using a ball mill or a planetary mill. The mixture may be melted at 800° C. to 1,300° C., followed by quenching to 25° C. The obtained resultant may be subjected to pulverization using a disc mill, a planetary mill, or the like, thereby preparing a glass frit.

The glass fit may have an average particle diameter (D50) of 0.1 μm to 10 μm, and may have a spherical or amorphous shape.

The glass frit may be present in an amount of about 0.1 wt % to about 20 wt %, for example, about 0.5 wt % to about 10 wt %, based on the total weight of the composition. Within this range, it may be possible to secure p-n junction stability given varying surface resistances while minimizing serial resistance so as to improve solar cell efficiency.

(C) Organic Vehicle

The organic vehicle may impart suitable viscosity and rheological characteristics for printing to the composition for solar cell electrodes through mechanical mixing with the inorganic component of the composition.

The organic vehicle may be a suitable organic vehicle used in solar cell electrode compositions. The organic vehicle may include a binder resin, a solvent, and the like.

The binder resin may be selected from acrylate resins or cellulose resins. For example, ethylcellulose may be used as the binder resin. In other implementations, the binder resin may be selected from among ethyl hydroxyethylcellulose, nitrocellulose, blends of ethylcellulose resin and phenol resin, alkyd, phenol, acrylate ester, xylene, polybutane, polyester, urea, melamine, vinyl acetate resins, wood rosin, polymethacrylates of alcohols, and the like.

The solvent may be selected from the group of, for example, hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, ethyl lactate, and combinations thereof.

The organic vehicle may be present in an amount of about 1 wt % to about 30 wt % based on the total weight of the composition. Within this range, the organic vehicle may provide sufficient adhesive strength and excellent printability to the composition.

(D) Additives

The composition may further include one or more additives to enhance flow and process properties and stability, as needed. For example, the additive may include a dispersant, a thixotropic agent, plasticizers, a viscosity stabilizer, an anti-foaming agent, a pigment, a UV stabilizer, an antioxidant, a coupling agent, or the like. The additive may be used alone or as mixtures thereof. These additive may be present in the composition in an amount, for example, of about 0.1 wt % to about 5 wt %.

Solar Cell Electrode and Solar Cell Including the Same

Other aspects of the invention relate to an electrode formed of the composition for solar cell electrodes and a solar cell including the same. FIG. 1 illustrates a solar cell in accordance with an embodiment of the invention.

Referring to FIG. 1, a rear electrode 210 and a front electrode 230 may be formed by printing and baking the composition according to an embodiment on a wafer or substrate 100 that includes a p-layer (or n-layer) 101 and an n-layer (or p-layer) 102, which will serve as an emitter. For example, a preliminary process of preparing the rear electrode 210 may be performed by printing the composition on the rear surface of the wafer 100 and drying the printed composition at about 200° C. to about 400° C. for about 10 seconds to about 60 seconds. Further, a preliminary process for preparing the front electrode may be performed by printing the paste on the front surface of the wafer and drying the printed composition. Then, the front electrode 230 and the rear electrode 210 may be formed by baking the wafer at about 400° C. to about 950° C., or, for example, at about 750° C. to about 950° C., for about 30 seconds to 180 seconds.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES 1 TO 72 AND COMPARATIVE EXAMPLES 1 TO 4

Example 1

As an organic binder, 3.0 wt % of ethylcellulose (STD4, Dow Chemical Company) was sufficiently dissolved in 6.5 wt % of butyl carbitol at 60° C. to form a binder solution. 86.90 wt % of spherical silver powder (AG-4-8, Dowa Hightech Co., Ltd.) having an average particle diameter of 2.0 μm, 3.1 wt % of glass frit including silver carbonate ($Ag_2CO_3$, Acros Organics) as a silver compound and prepared according to the composition as listed in Table 1, 0.2 wt % of a dispersant BYK102 (BYK-chemie), and 0.3 wt % of a thixotropic agent Thixatrol ST (Elementis Co., Ltd.) were added to the binder solution, followed by mixing and kneading in a 3-roll kneader, thereby preparing a composition for solar cell electrodes.

Examples 2 to 15

Compositions for solar cell electrodes were prepared in the same manner as in Example 1 except that the glass frits were prepared according to the compositions as listed in Table 1.

Examples 16 to 27

Compositions for solar cell electrodes were prepared in the same manner as in Example 1 except that glass frits containing silver iodide (AgI, Sigma-Aldrich GmbH) as a silver compound were prepared according to the compositions as listed in Table 2.

Examples 28 to 42

Compositions for solar cell electrodes were prepared in the same manner as in Example 1 except that glass frits containing silver nitrate ($AgNO_3$, Daejung Co., Ltd.) as a silver compound were prepared according to the compositions as listed in Table 3.

Examples 43 to 54

Compositions for solar cell electrodes were prepared in the same manner as in Example 1 except that glass frits containing that silver oxide ($Ag_2O$, Acros Organics) as a silver compound were prepared according to the compositions as listed in Table 4.

Examples 55 to 72

Compositions for solar cell electrodes were prepared in the same manner as in Example 1 except that glass frits containing silver cyanide (AgCN, Sigma-Aldrich GmbH) as a silver compound were prepared according to the compositions as listed in Table 5.

Comparative Examples 1 to 4

Compositions for solar cell electrodes were prepared in the same manner as in Example 1 except that the glass frits were prepared according to the compositions as listed in Tables 6 to 8.

Measurement of Mole Ratio of Ag:Te and Ag:Zn in Glass Fit Using ICP-OES

Pretreatment of samples: 0.5 g of a glass frit sample to be analyzed was placed in a beaker and weighed an accuracy of 0.0001 g. 5 ml of sulfuric acid ($H_2SO_4$) was added to the beaker, followed by heating at 220° C. for about 3 hours using a hot plate until the sample was completely carbonized. Hydrogen peroxide ($H_2O_2$) was added to the beaker until the beaker containing the carbonized sample became transparent, thereby completing pretreatment.

Preparation of Standard Solution

Standard solutions each of elemental silver (Ag), elemental tellurium (Te), and elemental zinc (Zn) were prepared.

Measurement of Mole Ratio of Ag:Te and Ag:Zn

Nitric acid ($HNO_3$) was added to the beaker containing the pre-treated sample, followed by heating for 5 minutes and air-cooling. The prepared standard solution was introduced into an ICP-OES tester (PerkinElmer, Inc.) and a calibration curve was plotted by an external standard method, followed by measuring and converting the concentration (ppm) of the elemental silver (Ag), elemental tellurium (Te) and elemental zinc (Zn) in the sample using the ICP-OES tester, thereby calculating the mole ratio of Ag:Te and Ag:Zn in the glass frit. Results are shown in Table 8 and 9.

Content of each element (%)=Concentration of each element (ppm)×Dilution Factor (DF)/10000

Mole of each element=Content of each element/Molecular weight of each element

Mole ratio of Ag:Te=1: (Mole of Te/Mole of Ag)

Mole ratio of Ag:Zn=1: (Mole of Zn/Mole of Ag)

TABLE 1

| | Composition of glass frit (unit: wt %) | | | | | | | | | | | | | | | | |
|---|---|---|---|---|---|---|---|---|---|---|---|---|---|---|---|---|---|
| | $AgCO_3$ | PbO | $Bi_2O_3$ | $TeO_2$ | $P_2O_5$ | $Li_2CO_3$ | $Na_2CO_3$ | $SiO_2$ | ZnO | $WO_3$ | $Nd_2O_3$ | MgO | SnO | SrO | $Sb_2O_3$ | $Cr_2O_3$ | Total |
| Example 1 | 5 | — | 40 | 42 | — | 2 | — | 3 | 5 | — | — | — | — | 3 | — | — | 100 |
| Example 2 | 10 | — | 30 | 42 | — | 2 | — | 3 | 10 | 3 | — | — | — | — | — | — | 100 |
| Example 3 | 30 | — | 20 | 32 | — | 2 | — | 8 | 5 | — | 3 | — | — | — | — | — | 100 |
| Example 4 | 5 | 40 | — | 48 | — | 2 | — | 2 | 3 | — | — | — | — | — | — | — | 100 |
| Example 5 | 10 | 13 | — | 67 | — | 2 | — | 3 | 5 | — | — | — | — | — | — | — | 100 |
| Example 6 | 27 | 20 | — | 40 | — | 2 | — | 5 | 3 | — | — | — | — | — | — | 3 | 100 |
| Example 7 | 4 | — | 40 | 40 | 10 | 2 | — | 2 | 2 | — | — | — | — | — | — | — | 100 |
| Example 8 | 13 | — | 30 | 45 | — | — | 3 | 3 | 6 | — | — | — | — | — | — | — | 100 |
| Example 9 | 26 | — | 5 | 53 | — | — | 5 | 4 | 3 | — | — | 2 | — | — | 2 | — | 100 |
| Example 10 | 3 | 24 | — | 63 | — | — | 2 | 3 | 2 | — | 3 | — | — | — | — | — | 100 |
| Example 11 | 18 | 35 | — | 34 | — | 2 | — | — | 11 | — | — | — | — | — | — | — | 100 |
| Example 12 | 22 | 30 | — | 27 | — | 2 | — | 8 | 6 | 3 | 2 | — | — | — | — | — | 100 |
| Example 13 | 7 | — | 14 | 47 | 3 | 2 | 3 | 3 | 11 | — | 2 | — | 5 | 3 | — | — | 100 |
| Example 14 | 14 | — | 27 | 42 | — | 2 | — | 3 | 7 | — | — | — | 2 | 3 | — | — | 100 |
| Example 15 | 25 | — | 20 | 37 | — | 2 | — | 8 | 5 | — | — | — | — | 3 | — | — | 100 |

TABLE 2

| | Composition of glass frit (unit: wt %) | | | | | | | | | | | | | | | | |
|---|---|---|---|---|---|---|---|---|---|---|---|---|---|---|---|---|---|
| | AgI | PbO | $Bi_2O_3$ | $TeO_2$ | $P_2O_5$ | $Li_2CO_3$ | $Na_2CO_3$ | $SiO_2$ | ZnO | $WO_3$ | $Nd_2O_3$ | MgO | SnO | SrO | $Sb_2O_3$ | $Cr_2O_3$ | Total |
| Example 16 | 6 | 40 | — | 41 | — | 2 | — | 3 | 6 | — | 2 | — | — | — | — | — | 100 |
| Example 17 | 13 | 35 | — | 33 | — | 2 | — | 3 | 9 | — | 3 | 2 | — | — | — | — | 100 |
| Example 18 | 22 | 20 | — | 29 | — | 3 | — | 8 | 7 | — | 3 | 2 | — | — | 6 | — | 100 |
| Example 19 | 4 | 13 | — | 62 | — | 2 | — | — | 17 | — | — | 2 | — | — | — | — | 100 |
| Example 20 | 21 | — | 5 | 45 | — | 2 | — | 3 | 12 | — | 3 | 2 | 2 | 5 | — | — | 100 |
| Example 21 | 29 | 12 | — | 39 | — | 2 | — | 8 | 5 | — | 2 | — | — | 3 | — | — | 100 |
| Example 22 | 6 | — | 34 | 50 | — | 2 | — | 2 | 5 | 1 | — | — | — | — | — | — | 100 |
| Example 23 | 15 | — | 29 | 42 | — | 5 | — | 2 | 6 | — | — | 1 | — | — | — | — | 100 |
| Example 24 | 30 | — | 13 | 40 | — | 2 | — | 5 | 7 | — | 3 | — | — | — | — | — | 100 |

TABLE 2-continued

| | Composition of glass frit (unit: wt %) | | | | | | | | | | | | | | | | |
|---|---|---|---|---|---|---|---|---|---|---|---|---|---|---|---|---|---|
| | AgI | PbO | Bi$_2$O$_3$ | TeO$_2$ | P$_2$O$_5$ | Li$_2$CO$_3$ | Na$_2$CO$_3$ | SiO$_2$ | ZnO | WO$_3$ | Nd$_2$O$_3$ | MgO | SnO | SrO | Sb$_2$O$_3$ | Cr$_2$O$_3$ | Total |
| Example 25 | 4 | 40 | 16 | 21 | 6 | 2 | — | 2 | 4 | — | — | — | — | — | — | 5 | 100 |
| Example 26 | 11 | 35 | 24 | 10 | 5 | 2 | — | 2 | 9 | — | — | — | — | — | — | 2 | 100 |
| Example 27 | 32 | 23 | — | 28 | 2 | 2 | — | 5 | 5 | — | — | — | — | — | — | 3 | 100 |

TABLE 3

| | Composition of glass frit (unit: wt %) | | | | | | | | | | | | | | | | |
|---|---|---|---|---|---|---|---|---|---|---|---|---|---|---|---|---|---|
| | AgNO$_3$ | PbO | Bi$_2$O$_3$ | TeO$_2$ | P$_2$O$_5$ | Li$_2$CO$_3$ | Na$_2$CO$_3$ | SiO$_2$ | ZnO | WO$_3$ | Nd$_2$O$_3$ | MgO | SnO | SrO | Sb$_2$O$_3$ | Cr$_2$O$_3$ | Total |
| Example 28 | 5 | 40 | — | 40 | — | 2 | — | 2 | 3 | — | — | — | — | — | 8 | — | 100 |
| Example 29 | 15 | — | 17 | 48 | — | 2 | — | 2 | 2 | — | — | — | — | — | 14 | — | 100 |
| Example 30 | 30 | — | 12 | 38 | — | 2 | — | 5 | 7 | — | — | — | — | — | 6 | — | 100 |
| Example 31 | 3 | — | 40 | 42 | — | 2 | — | 2 | 5 | — | — | 3 | — | 3 | — | — | 100 |
| Example 32 | 16 | — | 21 | 42 | — | 10 | — | 3 | 5 | 3 | — | — | — | — | — | — | 100 |
| Example 33 | 28 | — | 17 | 32 | — | 7 | — | 8 | 5 | — | 3 | — | — | — | — | — | 100 |
| Example 34 | 4 | 27 | — | 53 | — | 2 | — | 3 | 8 | — | — | — | 3 | — | — | — | 100 |
| Example 35 | 16 | 19 | — | 45 | — | 2 | 3 | 3 | 12 | — | — | — | — | — | — | — | 100 |
| Example 36 | 31 | 20 | — | 37 | — | 2 | — | 8 | 2 | — | — | — | — | — | — | — | 100 |
| Example 37 | 5 | — | 21 | 50 | — | 2 | — | 3 | 15 | — | — | 3 | 1 | — | — | — | 100 |
| Example 38 | 10 | — | 32 | 48 | — | 2 | — | 3 | 3 | — | — | — | 2 | — | — | — | 100 |
| Example 39 | 38 | — | — | 55 | — | 2 | — | 2 | 3 | — | — | — | — | — | — | — | 100 |
| Example 40 | 5 | 33 | — | 42 | — | 9 | — | 3 | 5 | — | — | — | — | 3 | — | — | 100 |
| Example 41 | 10 | 35 | — | 37 | — | 2 | — | 3 | 5 | 3 | — | — | — | — | 3 | 2 | 100 |
| Example 42 | 27 | 30 | — | 22 | — | 2 | — | 8 | 5 | — | 3 | 3 | — | — | — | — | 100 |

TABLE 4

| | Composition of glass frit (unit: wt %) | | | | | | | | | | | | | | | | |
|---|---|---|---|---|---|---|---|---|---|---|---|---|---|---|---|---|---|
| | Ag$_2$O | PbO | Bi$_2$O$_3$ | TeO$_2$ | P$_2$O$_5$ | Li$_2$CO$_3$ | Na$_2$CO$_3$ | SiO$_2$ | ZnO | WO$_3$ | Nd$_2$O$_3$ | MgO | SnO | SrO | Sb$_2$O$_3$ | Cr$_2$O$_3$ | Total |
| Example 43 | 4 | — | 40 | 36 | — | 2 | — | 3 | 9 | — | 2 | 3 | 1 | — | — | — | 100 |
| Example 44 | 8 | — | 35 | 34 | — | 2 | — | 3 | 8 | — | 3 | 5 | — | — | — | 2 | 100 |
| Example 45 | 11 | 14 | 20 | 27 | — | 2 | — | 8 | 13 | — | — | 3 | 2 | — | — | — | 100 |
| Example 46 | 2 | 5 | — | 61 | — | 2 | — | 3 | 25 | 2 | — | — | — | — | — | — | 100 |
| Example 47 | 5 | 32 | 13 | 37 | — | 2 | — | 3 | 8 | — | — | — | — | — | — | — | 100 |
| Example 48 | 10 | 30 | 12 | 21 | — | 2 | — | 8 | 9 | — | 2 | 3 | — | — | — | 3 | 100 |
| Example 49 | 5 | 2 | 35 | 45 | — | 2 | — | 3 | 5 | — | — | — | — | 3 | — | — | 100 |
| Example 50 | 7 | 7 | 35 | 37 | — | 2 | — | 3 | 5 | 3 | 1 | — | — | — | — | — | 100 |

TABLE 4-continued

| | Composition of glass frit (unit: wt %) | | | | | | | | | | | | | | | | |
|---|---|---|---|---|---|---|---|---|---|---|---|---|---|---|---|---|---|
| | $Ag_2O$ | PbO | $Bi_2O_3$ | $TeO_2$ | $P_2O_5$ | $Li_2CO_3$ | $Na_2CO_3$ | $SiO_2$ | ZnO | $WO_3$ | $Nd_2O_3$ | MgO | SnO | SrO | $Sb_2O_3$ | $Cr_2O_3$ | Total |
| Example 51 | 10 | 22 | 18 | 32 | — | 2 | — | 8 | 5 | — | 3 | — | — | — | — | — | 100 |
| Example 52 | 3 | 14 | — | 74 | — | 2 | — | 3 | 4 | — | — | — | — | — | — | — | 100 |
| Example 53 | 9 | 10 | — | 71 | — | 2 | — | 3 | 5 | — | — | — | — | — | — | — | 100 |
| Example 54 | 11 | 17 | 3 | 51 | 2 | 2 | 3 | 8 | 3 | — | — | — | — | — | — | — | 100 |

TABLE 5

| | Composition of glass frit (unit: wt %) | | | | | | | | | | | | | | | | |
|---|---|---|---|---|---|---|---|---|---|---|---|---|---|---|---|---|---|
| | AgCN | PbO | $Bi_2O_3$ | $TeO_2$ | $P_2O_5$ | $Li_2CO_3$ | $Na_2CO_3$ | $SiO_2$ | ZnO | $WO_3$ | $Nd_2O_3$ | MgO | SnO | SrO | $Sb_2O_3$ | $Cr_2O_3$ | Total |
| Example 55 | 3 | 8 | — | 44 | — | 2 | — | 3 | 23 | — | — | 2 | — | 5 | — | 10 | 100 |
| Example 56 | 21 | — | — | 47 | — | 2 | — | 3 | 10 | 7 | — | — | — | — | — | 10 | 100 |
| Example 57 | 36 | 8 | 7 | 34 | — | 2 | — | — | 5 | — | 3 | 5 | — | — | — | — | 100 |
| Example 58 | 5 | — | 31 | 50 | — | 2 | — | 2 | 9 | 1 | — | — | — | — | — | — | 100 |
| Example 59 | 13 | — | 32 | 45 | — | 2 | — | 2 | 5 | — | — | 1 | — | — | — | — | 100 |
| Example 60 | 24 | — | 30 | 33 | — | 2 | — | 5 | 3 | — | 3 | — | — | — | — | — | 100 |
| Example 61 | 4 | 34 | — | 50 | — | 2 | — | 3 | 7 | — | — | — | — | — | — | — | 100 |
| Example 62 | 11 | 35 | — | 44 | — | 2 | — | 3 | 5 | — | — | — | — | — | — | — | 100 |
| Example 63 | 32 | 13 | — | 40 | — | 2 | — | 8 | 5 | — | — | — | — | — | — | — | 100 |
| Example 64 | 6 | — | — | 47 | 5 | — | 3 | 18 | — | 5 | 3 | — | — | — | 10 | 3 | 100 |
| Example 65 | 15 | — | 10 | 40 | 7 | — | 3 | 11 | — | 5 | 4 | — | — | — | — | 5 | 100 |
| Example 66 | 30 | 15 | 16 | 30 | — | 2 | — | — | 7 | — | — | — | — | — | — | — | 100 |
| Example 67 | 3 | — | 37 | 50 | — | 2 | — | 2 | 5 | 1 | — | — | — | — | — | — | 100 |
| Example 68 | 16 | — | 29 | 44 | — | 2 | — | 2 | 6 | — | — | 1 | — | — | — | — | 100 |
| Example 69 | 28 | — | 29 | 40 | — | 1 | — | — | 2 | — | — | — | — | — | — | — | 100 |
| Example 70 | 4 | 37 | — | 40 | — | 2 | — | 2 | 4 | — | — | 2 | — | — | — | 9 | 100 |
| Example 71 | 16 | 8 | — | 54 | — | 2 | — | 2 | 2 | — | — | 3 | 4 | — | — | 9 | 100 |
| Example 72 | 27 | 5 | — | 60 | — | 2 | — | — | 2 | — | — | — | 4 | — | — | — | 100 |

TABLE 6

| | Composition of glass frit (unit: wt %) | | | | | | | | | | | | | | | | |
|---|---|---|---|---|---|---|---|---|---|---|---|---|---|---|---|---|---|
| | $AgCO_3$ | PbO | $Bi_2O_3$ | $TeO_2$ | $P_2O_5$ | $Li_2CO_3$ | $Na_2CO_3$ | $SiO_2$ | ZnO | $WO_3$ | $Nd_2O_3$ | MgO | SnO | SrO | $Sb_2O_3$ | $Cr_2O_3$ | Total |
| Comparative Example 1 | 0.1 | — | 25.9 | 54 | — | 4 | 2 | 5 | — | 6 | 3 | — | — | — | — | — | 100 |
| Comparative Example 2 | — | — | 19 | 50 | — | 3 | — | 8 | 12 | — | 5 | 3 | — | — | — | — | 100 |

TABLE 7

Composition of glass frit (unit: wt %)

| | AgNO$_3$ | PbO | Bi$_2$O$_3$ | TeO$_2$ | P$_2$O$_5$ | Li$_2$CO$_3$ | Na$_2$CO$_3$ | SiO$_2$ | ZnO | WO$_3$ | Nd$_2$O$_3$ | MgO | SnO | SrO | Sb$_2$O$_3$ | Cr$_2$O$_3$ | Total |
|---|---|---|---|---|---|---|---|---|---|---|---|---|---|---|---|---|---|
| Comparative Example 3 | 3 | — | 36 | 51 | — | 3 | — | 4 | — | — | 3 | — | — | — | — | — | 100 |

TABLE 8

Composition of glass frit (unit: wt %)

| | AgI | PbO | Bi$_2$O$_3$ | TeO$_2$ | P$_2$O$_5$ | Li$_2$CO$_3$ | Na$_2$CO$_3$ | SiO$_2$ | ZnO | WO$_3$ | Nd$_2$O$_3$ | MgO | SnO | SrO | Sb$_2$O$_3$ | Cr$_2$O$_3$ | Total |
|---|---|---|---|---|---|---|---|---|---|---|---|---|---|---|---|---|---|
| Comparative Example 4 | 10 | — | 19 | 53.9 | — | 2 | — | — | 0.1 | 2 | 5 | 3 | 5 | — | — | — | 100 |

TABLE 9

| | Mole ratio (Te/Ag) | Mole ratio (Zn/Ag) | | Mole ratio (Te/Ag) | Mole ratio (Zn/Ag) |
|---|---|---|---|---|---|
| Example 7 | 17.61 | 1.59 | Example 37 | 13.23 | 7.76 |
| Example 8 | 5.92 | 1.81 | Example 38 | 6.65 | 0.78 |
| Example 9 | 3.52 | 0.35 | Example 39 | 2.01 | 0.18 |
| Example 10 | 37.46 | 2.22 | Example 40 | 11.42 | 2.52 |
| Example 11 | 3.29 | 2.06 | Example 41 | 5.16 | 1.27 |
| Example 12 | 2.54 | 0.86 | Example 42 | 1.23 | 0.46 |
| Comparative Example 3 | 22.43 | — | | | |

Measurement of Serial Resistance, Fill Factor, and Conversion Efficiency

The compositions prepared in the examples and comparative examples were deposited over a front surface of a mono-crystalline wafer by screen-printing in a predetermined pattern, followed by drying in an IR drying furnace. Then, the aluminum paste was printed on a rear side of the wafer and dried in the same manner as above. Cells formed according to this procedure were subjected to baking at 700° C. to 950° C. for 30 to 180 seconds in a belt-type baking furnace, and evaluated as to serial resistance (Rs, mΩ), fill factor (FF, %), and conversion efficiency (%) using a solar cell efficiency tester CT-801 (Pasan Co., Ltd.). The measured serial resistance, fill factor, and conversion efficiency are shown in Table 10 to 12

TABLE 10

| | Series Resistance (mΩ) | Fill Factor (%) | Efficiency (%) |
|---|---|---|---|
| Example 1 | 3.32 | 77.92 | 16.92 |
| Example 2 | 2.94 | 78.51 | 17.34 |
| Example 3 | 2.65 | 79.22 | 17.75 |
| Example 4 | 3.22 | 78.00 | 17.01 |
| Example 5 | 2.91 | 78.63 | 17.38 |
| Example 6 | 2.75 | 78.94 | 17.59 |
| Example 7 | 3.07 | 78.23 | 17.22 |
| Example 8 | 2.92 | 78.58 | 17.37 |
| Example 9 | 2.72 | 79.10 | 17.69 |
| Example 10 | 3.26 | 77.97 | 16.96 |
| Example 11 | 2.94 | 78.56 | 17.37 |
| Example 12 | 2.64 | 79.23 | 17.75 |
| Example 13 | 3.31 | 77.93 | 16.94 |
| Example 14 | 2.98 | 78.45 | 17.30 |
| Example 15 | 2.72 | 79.09 | 17.68 |
| Example 16 | 3.37 | 77.92 | 16.89 |
| Example 17 | 2.87 | 78.68 | 17.43 |
| Example 18 | 2.81 | 78.83 | 17.52 |
| Example 19 | 3.12 | 78.10 | 17.14 |
| Example 20 | 2.97 | 78.50 | 17.34 |
| Example 21 | 2.74 | 79.01 | 17.63 |
| Example 22 | 3.12 | 78.15 | 17.15 |
| Example 23 | 2.87 | 78.74 | 17.44 |
| Example 24 | 2.67 | 79.14 | 17.71 |
| Example 25 | 3.18 | 78.04 | 17.04 |
| Example 26 | 2.87 | 78.73 | 17.44 |

TABLE 11

| | Series Resistance (mΩ) | Fill Factor (%) | Efficiency (%) |
|---|---|---|---|
| Example 27 | 2.75 | 79.00 | 17.62 |
| Example 28 | 3.38 | 77.85 | 16.87 |
| Example 29 | 2.91 | 78.59 | 17.37 |
| Example 30 | 2.82 | 78.81 | 17.52 |
| Example 31 | 3.07 | 78.32 | 17.23 |
| Example 32 | 2.73 | 79.05 | 17.64 |
| Example 33 | 2.58 | 79.43 | 17.81 |
| Example 34 | 3.27 | 77.94 | 16.94 |
| Example 35 | 2.94 | 78.58 | 17.37 |
| Example 36 | 2.75 | 78.95 | 17.61 |
| Example 37 | 3.34 | 77.92 | 16.90 |
| Example 38 | 2.98 | 78.48 | 17.31 |
| Example 39 | 2.65 | 79.18 | 17.74 |
| Example 40 | 3.39 | 77.78 | 16.85 |
| Example 41 | 2.98 | 78.46 | 17.30 |
| Example 42 | 2.73 | 79.08 | 17.67 |
| Example 43 | 3.20 | 78.00 | 17.03 |
| Example 44 | 2.86 | 78.78 | 17.46 |
| Example 45 | 2.72 | 79.09 | 17.68 |
| Example 46 | 3.16 | 78.06 | 17.06 |
| Example 47 | 2.85 | 78.80 | 17.50 |
| Example 48 | 2.70 | 79.13 | 17.70 |
| Example 49 | 3.13 | 78.07 | 17.09 |
| Example 50 | 2.86 | 78.78 | 17.48 |
| Example 51 | 2.76 | 78.90 | 17.58 |
| Example 52 | 3.11 | 78.17 | 17.19 |

TABLE 12

|  | Series Resistance (mΩ) | Fill Factor (%) | Efficiency (%) |
|---|---|---|---|
| Example 53 | 2.86 | 78.77 | 17.45 |
| Example 54 | 2.60 | 79.26 | 17.76 |
| Example 55 | 3.25 | 77.98 | 16.99 |
| Example 56 | 2.82 | 78.81 | 17.50 |
| Example 57 | 2.56 | 79.44 | 17.83 |
| Example 58 | 3.15 | 78.06 | 17.08 |
| Example 59 | 2.94 | 78.55 | 17.36 |
| Example 60 | 2.62 | 79.24 | 17.75 |
| Example 61 | 3.04 | 78.33 | 17.24 |
| Example 62 | 2.87 | 78.70 | 17.43 |
| Example 63 | 2.42 | 79.53 | 17.99 |
| Example 64 | 3.07 | 78.33 | 17.24 |
| Example 65 | 2.83 | 78.80 | 17.50 |
| Example 66 | 2.58 | 79.33 | 17.80 |
| Example 67 | 3.12 | 78.09 | 17.09 |
| Example 68 | 2.87 | 78.72 | 17.44 |
| Example 69 | 2.73 | 79.06 | 17.65 |
| Example 70 | 3.08 | 78.18 | 17.22 |
| Example 71 | 2.86 | 78.76 | 17.44 |
| Example 72 | 2.60 | 79.29 | 17.77 |
| Comparative Example 1 | 4.53 | 76.65 | 16.29 |
| Comparative Example 2 | 4.62 | 76.36 | 16.16 |
| Comparative Example 3 | 4.44 | 76.65 | 16.48 |
| Comparative Example 4 | 3.98 | 77.05 | 16.70 |

Referring to Tables 10 to 12, it could be seen that the solar cell electrodes fabricated using the compositions including the glass frits that had a mole ratio of Ag:Te ranging from about 1:0.1 to about 1:50 and a mole ratio of Ag:Zn ranging from about 1:0.1 to about 1:40 in Examples 1 to 72 had low serial resistance, thereby providing excellent fill factor and conversion efficiency, as compared with those of Comparative Examples 1, 3, and 4, in which the mole ratios of Ag:Te and Ag:Zn were out of the ranges as described, and Comparative Example 2, in which silver was not contained in the glass frit.

By way of summation and review, when emitter thickness of a solar cell is reduced in order to improve solar cell efficiency, shunting that deteriorates solar cell performance may result. In addition, when an area of solar cells is increased in order to achieve higher efficiency, efficiency of the solar cell may deteriorate due to an increase in solar cell contact resistance. Therefore, a composition for solar cell electrodes that can enhance contact efficiency between electrodes and a silicon wafer to minimize contact resistance (Rc) and serial resistance (Rs) is desirable.

Embodiments provide a composition for solar cell electrodes such that solar cell electrodes produced from the composition have minimized contact resistance (Rc) and serial resistance (Rs), thereby providing excellent fill factor and conversion efficiency Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A composition for a solar cell electrode, the composition comprising:
   a silver (Ag) powder;
   a glass frit containing silver (Ag), tellurium (Te), and zinc (Zn), wherein the glass frit is formed of a mixture comprising a silver compound, a tellurium oxide, and a zinc oxide, and the amount of the silver compound being from more than 10 wt % to about 38% of the mixture; and
   an organic vehicle,
   wherein the glass frit has a mole ratio of Ag to Te ranging from 1:5.92 to about 1:50 and a mole ratio of Ag to Zn ranging from 1:1.27 to about 1:40.

2. The composition as claimed in claim 1, wherein the glass frit further includes one or more of lead (Pb), bismuth (Bi), phosphorus (P), germanium (Ge), gallium (Ga), cerium (Ce), iron (Fe), silicon (Si), lithium (Li), tungsten (W), magnesium (Mg), cesium (Cs), strontium (Sr), molybdenum (Mo), titanium (Ti), tin (Sn), indium (In), vanadium (V), ruthenium (Ru), barium (Ba), nickel (Ni), copper (Cu), sodium (Na), potassium (K), arsenic (As), cobalt (Co), zirconium (Zr), manganese (Mn), neodymium (Nd), chromium (Cr), antimony (Sb) or aluminum (Al).

3. The composition as claimed in claim 1, wherein the silver compound includes one or more of silver cyanide, silver nitrate, silver halide, silver carbonate, or silver acetate.

4. The composition as claimed in claim 1, further including one or more of a lead (Pb) oxide, a bismuth (Bi) oxide, a phosphorus (P) oxide, a germanium (Ge) oxide, a gallium (Ga) oxide, a cerium (Ce) oxide, an iron (Fe) oxide, a silicon (Si) oxide, a lithium (Li) oxide, a tungsten (W) oxide, a magnesium (Mg) oxide, a cesium (Cs) oxide, a strontium (Sr) oxide, a molybdenum (Mo) oxide, a titanium (Ti) oxide, a tin (Sn) oxide, an indium (In) oxide, a vanadium (V) oxide, a ruthenium (Ru) oxide, a barium (Ba) oxide, a nickel (Ni) oxide, a copper (Cu) oxide, a sodium (Na) oxide, a potassium (K) oxide, an arsenic (As) oxide, a cobalt (Co) oxide, a zirconium (Zr) oxide, a manganese (Mn) oxide, a neodymium (Nd) oxide, a chromium (Cr) oxide, an antimony (Sb) oxide, or an aluminum (Al) oxide.

5. The composition as claimed in claim 1, including:
   about 60 wt % to about 95 wt % of the silver powder;
   about 0.1 wt % to about 20 wt % of the glass fit; and
   about 1 wt % to about 30 wt % of the organic vehicle.

6. The composition as claimed in claim 1, wherein the glass frit has an average particle size (D50) ranging from about 0.1 μm to about 10 μm.

7. The composition as claimed in claim 1, further comprising one or more of a dispersant, a thixotropic agent, a plasticizer, a viscosity stabilizer, an antifoaming agent, a pigment, a UV stabilizer, an antioxidant, and a coupling agent.

8. The composition as claimed in claim 1, wherein the glass frit has a mole ratio of Ag to Zn ranging from about 1:1.27 to about 1:7.76.

* * * * *